（12）United States Patent
Kawase

(10) Patent No.: US 11,330,234 B2
(45) Date of Patent: May 10, 2022

(54) ELECTRONIC DEVICE AND PROJECTORS

(71) Applicant: Sharp NEC Display Solutions, Ltd., Tokyo (JP)

(72) Inventor: Ryosuke Kawase, Tokyo (JP)

(73) Assignee: SHARP NEC DISPLAY SOLUTIONS, LTD., Tokyo (JP)

( * ) Notice: Subject to any disclaimer, the term of this patent is extended or adjusted under 35 U.S.C. 154(b) by 0 days.

(21) Appl. No.: 17/058,074

(22) PCT Filed: May 23, 2019

(86) PCT No.: PCT/JP2019/020391
§ 371 (c)(1),
(2) Date: Nov. 23, 2020

(87) PCT Pub. No.: WO2019/225679
PCT Pub. Date: Nov. 28, 2019

(65) Prior Publication Data
US 2021/0208489 A1    Jul. 8, 2021

(51) Int. Cl.
*H04N 9/31*    (2006.01)
*H05K 7/20*    (2006.01)
(Continued)

(52) U.S. Cl.
CPC ......... *H04N 9/3144* (2013.01); *G03B 21/006* (2013.01); *G03B 21/145* (2013.01); *G03B 21/16* (2013.01); *H05K 7/20972* (2013.01)

(58) Field of Classification Search
CPC .. H04N 9/3144; G03B 21/006; G03B 21/145; G03B 21/16; H05K 7/20972
(Continued)

(56) References Cited

U.S. PATENT DOCUMENTS 6,290,360 B1    9/2001 Konuma et al.
6,343,862 B1 *   2/2002 Sawai ................. G02B 3/0056
                                                    349/8
(Continued)

FOREIGN PATENT DOCUMENTS

CN    103959163 A    7/2014
CN    106104179 A    11/2016
(Continued)

OTHER PUBLICATIONS

International Search Report (ISR) (PCT Form PCT/ISA/210), in PCT/JP2019/020391, dated Jul. 16, 2019.
(Continued)

*Primary Examiner* — Jerry L Brooks
(74) *Attorney, Agent, or Firm* — McGinn I.P. Law Group, PLLC.

(57) ABSTRACT

An electronic device includes a first duct for guiding the air blown out from blowers for cooling a liquid crystal panel mounted on an illumination optical system to the liquid crystal panel, a second duct for guiding the air passing through the liquid crystal panel in the opposite direction of the air blown out from the blowers, a heat sink for removing heat from the air passing through the second duct and a blower holding unit for holding the blowers are provided in a dust-proof case, and the top surface of the blower holding unit, the blower holding unit forms a third duct for guiding the air from which heat has been removed by the heat sink to the air inlet of the blowers that is a space formed along the top surface of the dust-proof case.

20 Claims, 17 Drawing Sheets

(51) Int. Cl.
  *G03B 21/00* (2006.01)
  *G03B 21/14* (2006.01)
  *G03B 21/16* (2006.01)
(58) Field of Classification Search
  USPC .......................................................... 353/58
  See application file for complete search history.

(56) References Cited

U.S. PATENT DOCUMENTS

| | | | |
|---|---|---|---|
| 2008/0252857 A1 | 10/2008 | Zheng et al. | |
| 2013/0242271 A1* | 9/2013 | Jougo | H04N 9/3144 353/61 |
| 2016/0299414 A1* | 10/2016 | Usuda | G03B 21/16 |
| 2016/0353067 A1* | 12/2016 | Kadotani | H04N 9/3144 |
| 2017/0052434 A1 | 2/2017 | Masuda | |

FOREIGN PATENT DOCUMENTS

| | | |
|---|---|---|
| JP | H07-152009 A | 6/1995 |
| JP | 3467697 B2 | 11/2003 |
| JP | 2008-026422 A | 2/2008 |
| JP | 2010-107631 A | 5/2010 |
| JP | 2011-076069 A | 4/2011 |
| JP | 2011-215457 A | 10/2011 |
| JP | 2015-194716 A | 11/2015 |
| JP | 2016-057446 A | 4/2016 |
| JP | 2016-200656 A | 12/2016 |
| JP | 2016-218383 A | 12/2016 |
| JP | 2019-020561 A | 2/2019 |
| WO | WO 2019/225013 A1 | 11/2019 |

OTHER PUBLICATIONS

Chinese Office Action, dated Jul. 23, 2021, in Chinese Application No. 201880093812.1 and English Translation thereof.
Chinese Office Action, dated Jul. 30, 2021, in Chinese Application No. 201980035406.4 and English Translation thereof.
Japanese Office Action, dated Nov. 29, 2021, in Japanese Application No. 2020-520993 and English Translation thereof.

* cited by examiner

Cooling duct(upper housing)

Cooling duct(lower housing)

After assembling

ELECTRONIC DEVICE AND PROJECTORS

TECHNICAL FIELD

The present invention relates to electronic device and projectors.

BACKGROUND ART

Main modules constituting a projection type display device for projecting an image include light sources such as lamps, lasers, and LEDs (Light Emitting Diode), illumination optical systems, projection lenses, electronic substrates, and power supplies. Optical electronic components for generating images using an optical modulator such as DMD (Digital Mirror Device) or a liquid crystal panel is mounted on the illumination optical system. In response to an external video signal, an electronic substrate generates a drive signal for driving the optical modulator. Strong light is sent from the light source of the lamp or laser/LED to the illumination optical system and irradiates the light modulator through each optical component. The projection lens enlarges the light emitted from the light modulator and projects it on the screen.

In these processes, the electronic component generates heat due to electrical resistance, the optical component temperature rise due to the absorption of light is generated. Each component must be operated so as not to exceed the allowable temperature to achieve the desired performance. Therefore, a plurality of cooling fans are mounted in the device, the blower from the cooling fan cools each component, to prevent a temperature increase so as not to exceed the allowable temperature. Further, since the life time of the liquid crystal panel is determined according to the temperature, it is necessary to further reduce the temperature.

For example, a pair of fans are respectively arranged on both sides of the projection lens, an apparatus for performing cooling is considered (e.g., see Patent Document 1.).

In the cooling of the display device, it is necessary to prevent the dust from entering the device from the outside together with the cooling air and adhering to the optical components, etc. to cause luminance deterioration. Therefore, generally the optical component is surrounded by a box, the mating portion of the box is sealed with a packing such as a soft metal such as cushion or rubber or copper, and has a structure to prevent the inflow of dust. Strong light is sent into the enclosed box.

PRIOR ART DOCUMENTS

Patent Document

[Patent Document 1] U.S. Pat. No. 3,467,697

SUMMARY OF THE INVENTION

Problem to be Solved by the Invention

In the sealed structure as described above, when attempting to cool the illumination optical system, the gap between the cooling duct and the illumination optical system from the blower to the illumination optical system, and sealing of the gap between the circulation duct and the illumination optical system is required, and the closed structure is needed for all circulation paths. Thus, if the sealing with many sealing portions complicated shapes, increasing the dust entry point causes a deterioration in performance, also, there is a problem that the size of the illumination optical system including the cooling structure is increased.

An object of the present invention is to provide an electronic device and a projector to solve the problems described above.

A Means for Solving the Problem

The electronic device of the present invention,
an electronics device, comprising:
an illumination optical system that outputs light to a projection lens,
a plurality of blowers that cools liquid crystal panels mounted on the illumination optical system,
a first duct that guides the air blown out from the plurality of blowers to the liquid crystal panels,
a second duct that guides the air passing through the liquid crystal panel in the direction opposite to the direction of the air blown out from the plurality of blowers,
a heat sink that removes heat from the air that has passed through the second duct; and
a blower holding member that holds the plurality of blowers, wherein
the illumination optical system, the plurality of blowers, the first duct, the second duct, the heat sink and the blower holding member are provided in a dust-proof case,
the second duct is formed surrounded by at least the inner wall of the top surface of the dust-proof case and the top surface of the blower holding member and is formed along the top surface of the dust-proof case,
the blower holding member forms a third duct for guiding the air from which heat has been removed by the heat sink to the air inlet of the plurality of blowers.

Further, the projector of the present invention,
an electronic device, comprising
an illumination optical system that outputs light to a projection lens,
a plurality of blowers that cools liquid crystal panels mounted on the illumination optical system,
a first duct that guides the air blown out from the plurality of blowers to the liquid crystal panels,
a second duct that guides the air passing through the liquid crystal panel in the direction opposite to the direction of the air blown out from the plurality of blowers,
a heat sink that removes heat from the air that has passed through the second duct; and
a blower holding member that holds the plurality of blowers, wherein
the illumination optical system, the plurality of blowers, the first duct, the second duct, the heat sink and the blower holding member are provided in a dust-proof case,
the second duct is formed surrounded by at least the inner wall of the top surface of the dust-proof case and the top surface of the blower holding member and is formed along the top surface of the dust-proof case,
the blower holding member forms a third duct for guiding the air from which heat has been removed by the heat sink to the air inlet of the plurality of blowers,
a light source, wherein
the electronic device that receives the light from the light source and modulates the incident light.

Effect of the Invention

As described above, in the present invention, it is possible to perform efficient cooling in a sealed structure.

EXEMPLARY EMBODIMENT

This will be described below with reference to the accompanying drawings embodiments of the present invention.

First Embodiment

Figure 1:
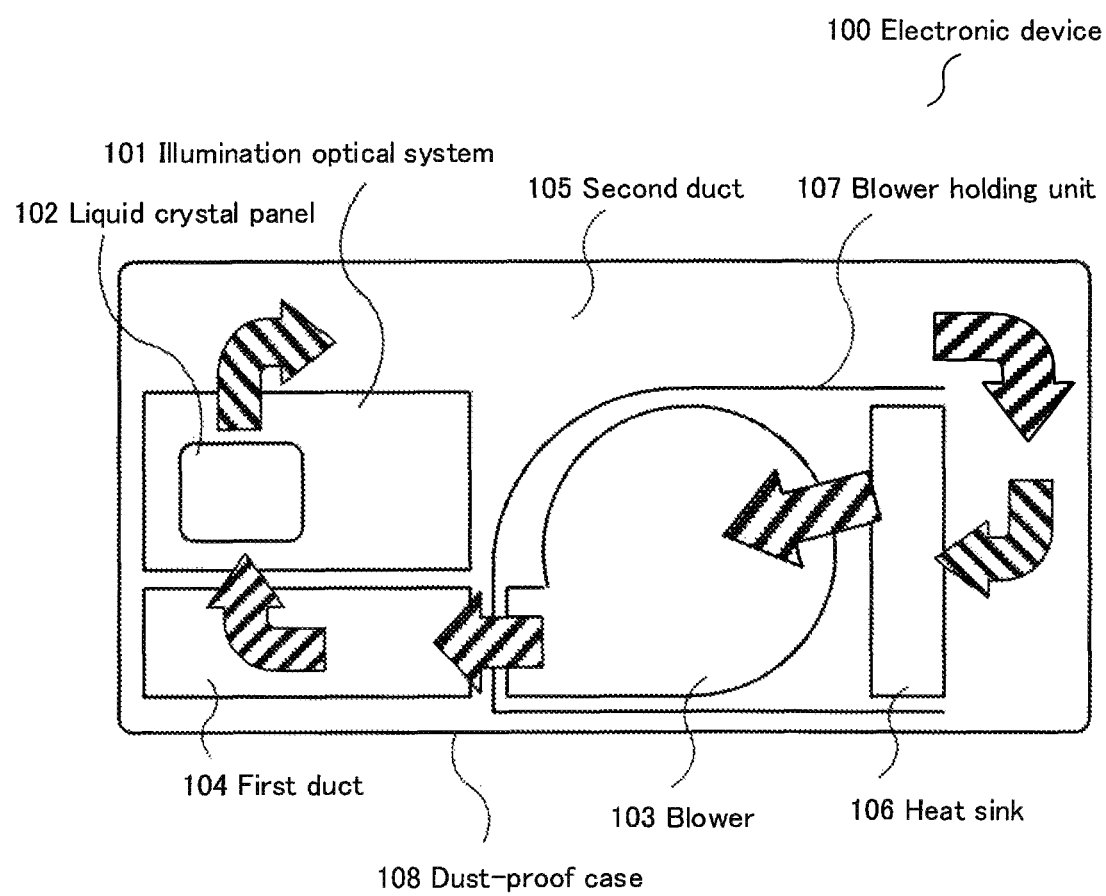
FIG. 1 is a diagram illustrating a first embodiment of the electronic device of the present invention.

FIG. 1 is a diagram illustrating a first embodiment of the electronic device of the present invention. Electronic device 100 in this embodiment, as shown in FIG. 1, illumination optical system 101, liquid crystal panel 102, blower 103, first duct 104, second duct 105, heat sink 106, and blower holding unit 107. Illumination optical system 101 projects the light. Blower 103 cools liquid crystal panel 102 mounted on illumination optical system 101. First duct 104 guides the air blown from blower 103 to liquid crystal panel 102. Second duct 105 guides the air passing through liquid crystal panel 102 in the opposite direction to the direction of the air blown out from blower 103. Heat sink 106 removes heat the air passing through second duct 105. Blower holding unit 107 is a blower holding member holds blower 103, and guides the air which is removed heat by heat sink 106 to the air inlet of blower 103. Each of these components is housed in dust-proof case 108 having a sealed structure.

Thus, in dust-proof case 108, the air blown out from blower 103 for cooling liquid crystal panel 102 is guided to heat sink 106 using a first duct and a second duct, the air removed heat by heat sink 106 is circulated to the air inlet of blower 103. Thus, it is possible to perform efficient cooling in a sealed structure.

Second Embodiment

Figure 2:
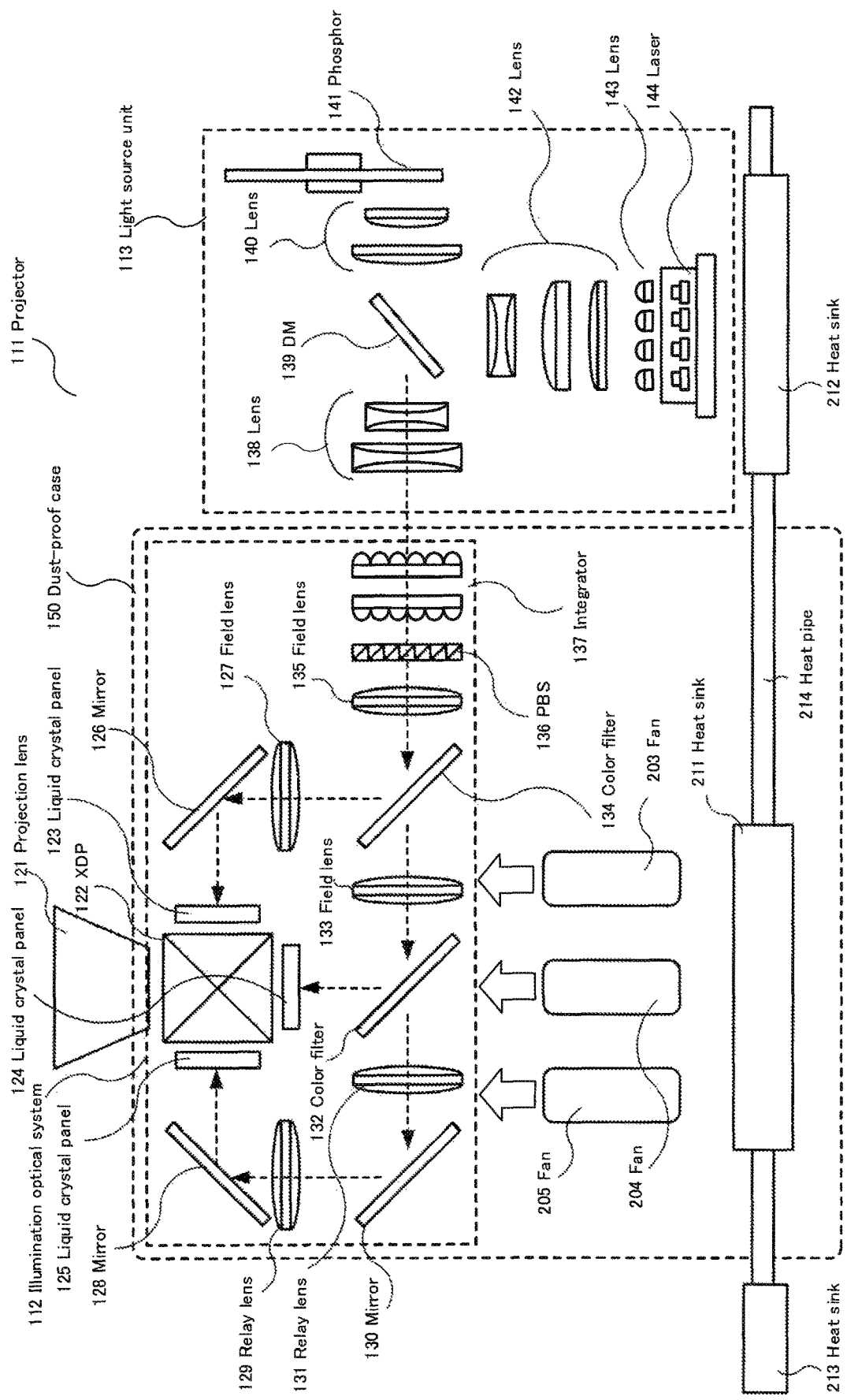
FIG. 2 is a diagram illustrating a second embodiment of the electronic device of the present invention.

FIG. 2 is a diagram illustrating a second embodiment of the electronic device of the present invention. Projector 111, which is an electronic device in this embodiment, as shown in FIG. 2, has illumination optical system 112 and light source unit 113.

Illumination optical system 112 for outputting light to projection lens 121 has a XDP122 which is a cross dichroic prism, three liquid crystal panels 123-125, mirror 126, field lens 127, mirror 128, relay lens 129, mirror 130, relay lens 131, color filter 132, field lens 133, color filter 134, field lens 135, PBS (Polarizing Beam Splitter) 136 which is a polarizing beam splitter, and integrator 137 for adjusting the uniformity of illuminance. Light source unit 113 includes lens 138, DM139, lens 140, phosphor 141, lens 142, lens 143, and laser 144. Each component of illumination optical system 112 and light source unit 113 is identical to that of a typical projector.

Light from laser 144 is output using other components constituting light source unit 113. Also, in this embodiment, of the light that passed through integrator 137, PBS136 and field lens 135, blue light is reflected by color filter 134, passes through field lens 127 and is reflected by mirror 126. Also, of the light that has passed through integrator 137, PBS136 and field lens 135, green light passes through color filter 134 and field lens 133 and is reflected color filter 132. Also, of the light that has passed through integrator 137, PBS136 and field lens 135, red light passes through color filter 134, field lens 133, color filter 132 and relay lens 131, is reflected by mirror 130, passes through relay lens 129 and is reflected by mirror 128. Therefore, liquid crystal panel 123 modulates the blue light. Further, liquid crystal panel 124 modulates the green light. Further, liquid crystal panel 125 modulates the red light.

In the arrangement of such a 3LCD, the planar shape of illumination optical system 112 is a rectangle in the direction in which liquid crystal panel 123 and liquid crystal panel 125 face the long side.

Fans 203 to 205, which are blowers, are provided to cool liquid crystal panels 123-125, respectively. Fans 203 to 205 are arranged side by side along a first direction in which liquid crystal panel 123 and liquid crystal panel 125 of liquid crystal panels 123 to 125 face each other on a side opposite to the side in which projection lens 121 of liquid crystal panels 123 to 125 is disposed. Fans 203 to 205 are also arranged such that their respective inlets face each other. Incidentally, when the components constituting illumination optical system 112 are housed in one rectangular parallelepiped that can store their layout (broken line of illumination optical system 112 shown in FIG. 2) or a housing having a shape corresponding thereto, fans 203 to 205 are disposed on the surface side facing the surface on which projection lens 121 of the housing is disposed. In that case, fans 203 to 205 may be disposed within the housing or may be disposed outside the housing.

Further, heat sink 211 is disposed on a side of fans 203 to 205 opposite to the side of illumination optical system 112. Heat sink 211 removes heat from the intake air drawn in by fans 203-205. Illumination optical system 112, fans 203-205, and heat sink 211 are housed in dust-proof case 150 that maintains a sealed state. Furthermore, heat sink 211 is connected to heat sink 212,213 for heat radiation provided on the outside of dust-proof case 150. Heat sink 211 and heat sink 212,213 for heat radiation are connected via heat pipe 214 which passes through the two surfaces of dust-proof case 150 facing each in a direction perpendicular to the direction of the air blown out from fan 203 to 205. It is needless to say that the sealing is made in that portion on the surface of dust-proof case 150 which heat pipe 214 penetrates. By this connection, the heat that heat sink 211 is absorbed (removals heat) is transferred to heat sink 212,213 through heat pipe 214, and the heat that is transferred to heat sink 212,213 is released to the outside.

In FIG. 2, a cooling duct for guiding the air blown out from fans 203 to 205 to liquid crystal panels 123 to 125, respectively, and a high-temperature air duct for guiding the air passing through liquid crystal panels 123 to 125 to heat sink 211 are not shown. These will be described with reference to FIG. 7 to be described later.

Figure 3:
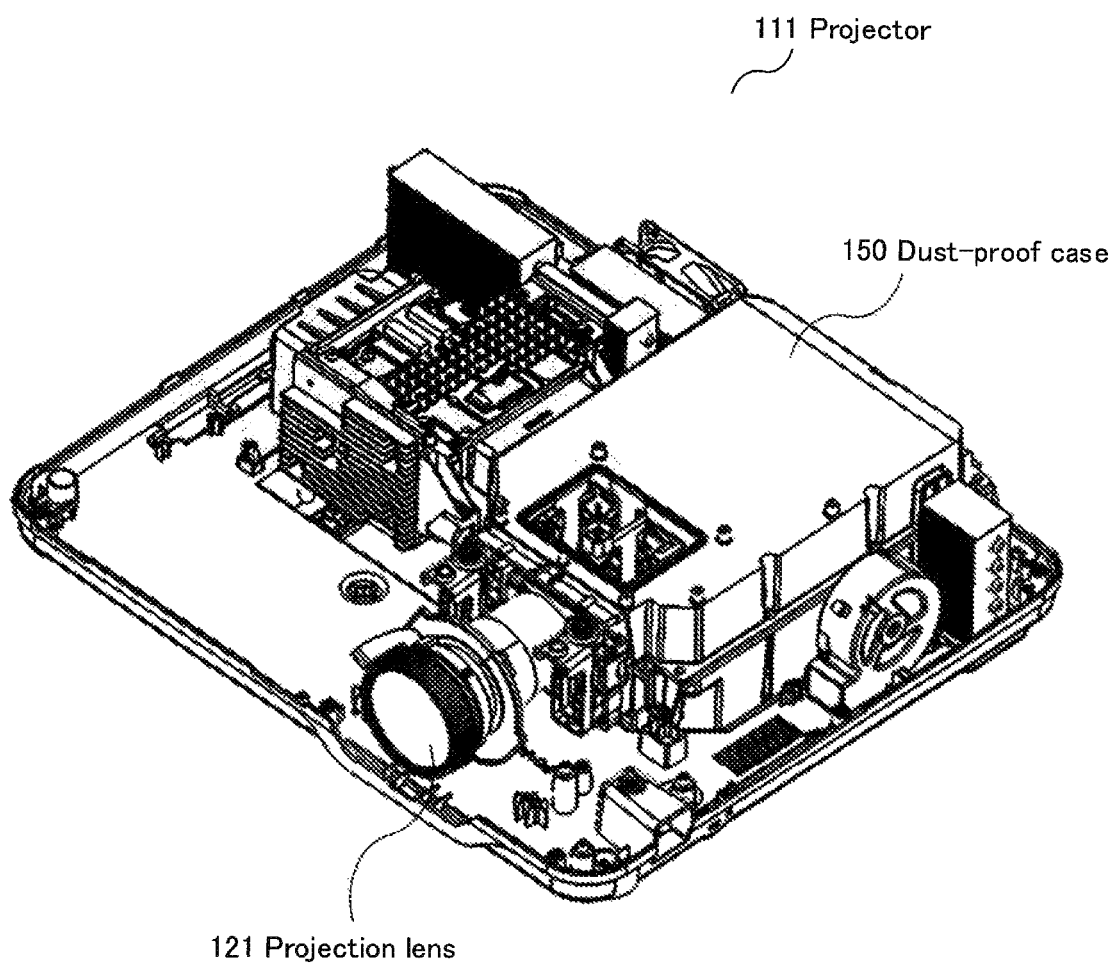
FIG. 3 is a diagram illustrating an example of the appearance of projector 111 in this embodiment.

FIG. 3 is a diagram illustrating an example of the appearance of projector 111 in this embodiment. As shown in FIG. 3, dust-proof case 150 is provided inside projector 111. Illumination optical system 112, fans 203 to 205, and heat sink 211 are housed in dust-proof case 150. Further, dust-proof case 150 has a structure in which the upper housing and the lower housing are coupled so as to sandwich projection lens 121. Further, the coupling portion between the upper housing and the lower housing is coupled using packing at the flat portion, and using cushion material at the convex portion and the concave portion.

Figure 4:
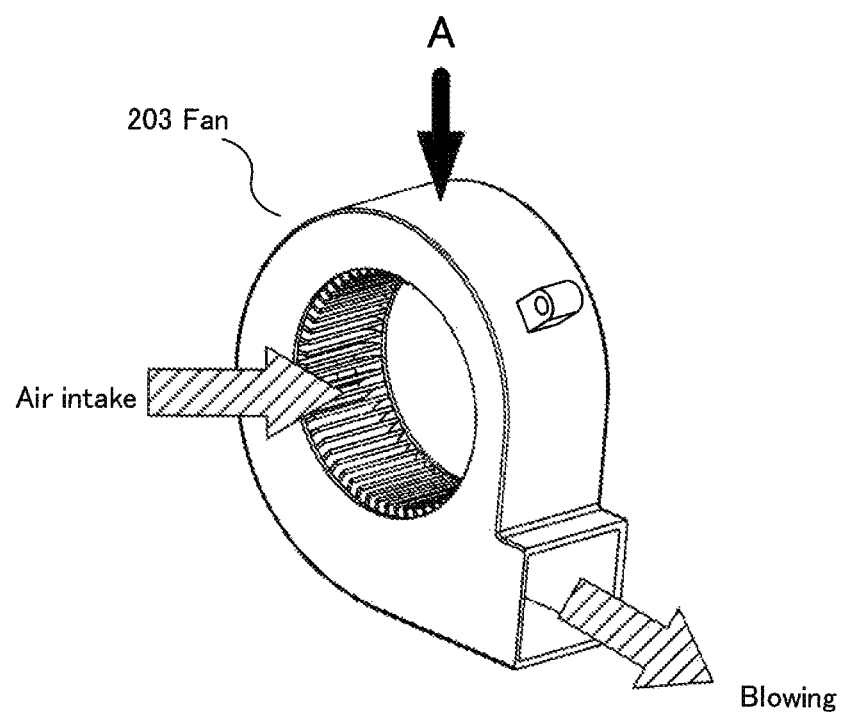
FIG. 4 is a diagram illustrating an example of the appearance of the fan shown in FIG. 2.
Figure 5:
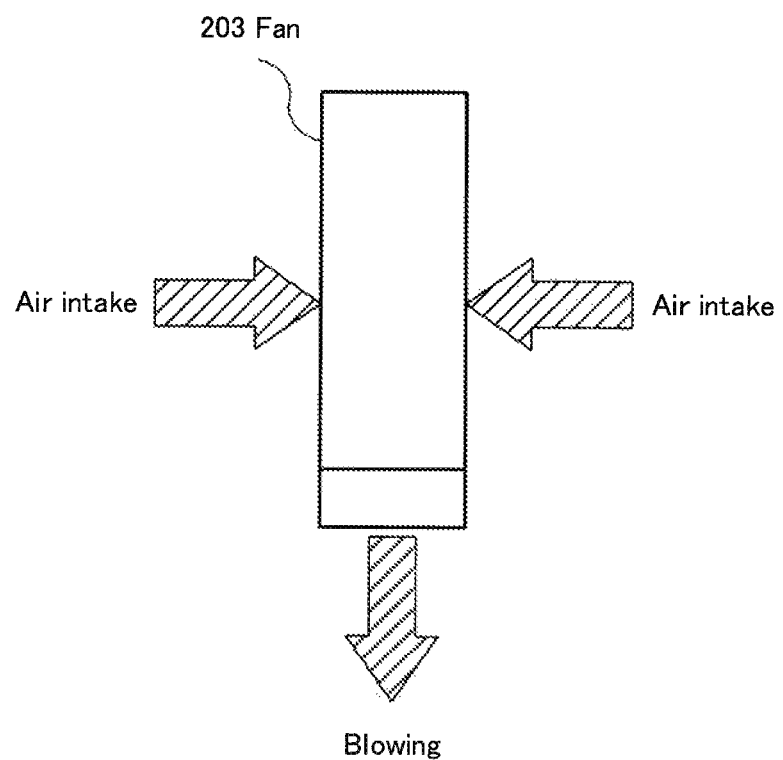
FIG. 5 is a plan view of the fan shown in FIG. 4 viewed from the direction of A.

FIG. 4 is a diagram illustrating an example of the appearance of fan 203 shown in FIG. 2. FIG. 5 is a plan view of fan 203 shown in FIG. 4 viewed from the direction of A. Incidentally, the same applies to fan 204,205 shown in FIG. 2. As shown in FIGS. 4 and 5, fan 203 in this embodiment is a blower fan that performs air intake from the side surface of fan 203, blowing in a direction perpendicular to the intake direction. That is, fan 203 is a blower fan in which the direction of the air intake and the direction of the blowing are perpendicular, characterized by a high static pressure. Incidentally, in the example shown in FIG. 5, as an example in which air intake is performed from both sides of fan 203, air intake may be performed from only one side.

Incidentally, the rotation of fans 203 to 205 is individually controlled, and the rotational speed may be different from each other. This rotational speed may be set in advance based on the operation of the light modulation in liquid crystal panels 123 to 125, may be one that measures the temperature of liquid crystal panels 123 to 125 and is controlled based on the measured temperature, or may be one that is controlled based on the use period of liquid crystal panels 123 to 125.

Figure 6:
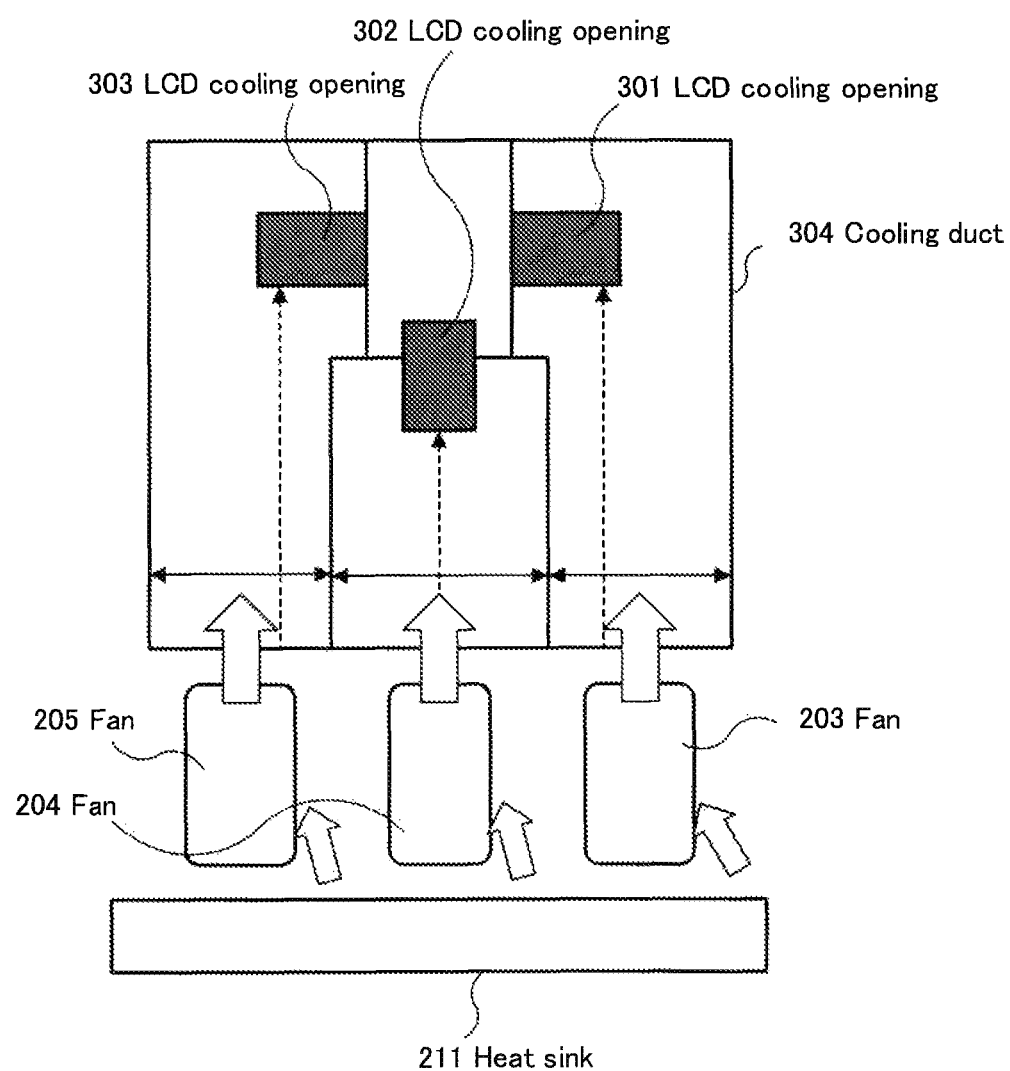
FIG. 6 is a plan view illustrating an example of a configuration of a cooling duct for guiding the cooling air blown out from the fan shown in FIG. 2 to the liquid crystal panel.

FIG. 6 is a plan view illustrating an example of a configuration of a cooling duct for guiding the cooling air blown out from fans 203 to 205 shown in FIG. 2 to liquid crystal panels 123 to 125. As shown in FIG. 6, the cooling air blown out from fans 203 to 205 that suck the air from which heat has been removed by heat sink 211 passes through the respective spaces provided in cooling duct 304 and is guided to LCD cooling openings 301 to 303 for cooling liquid crystal panels 123 to 125, respectively. In FIG. 6, a high-temperature air duct for guiding the air passing through liquid crystal panels 123 to 125 to heat sink 211 is not shown.

Incidentally, fans 203 to 205 are arranged at intervals at which a predetermined intake amount can be secured. Further, a partition plate may be provided between each of fans 203 to 205. Further, when fans 203 to 205 perform air intake from both sides, the position of the partition plate may be determined based on the ratio of the air intake capacity from one side to the air intake capacity from the other side. Specifically, for example, when the air intake capacity from the left side surface of fans 203 to 205 is larger than the air intake capacity from the right side surface, the distance from the left side surface of fans 203 to 205 to the partition plate on the left side may be longer than the distance from the right side surface of fans 203 to 205 to the partition plate on the right side.

Also, the positions of the respective air outlets of fans 203 to 205 with respect to cooling ducts 304, i.e., the distances from the air outlets of fans 203 to 205 to the receptacles of cooling ducts 304, are preferably equal to each other.

Further, as shown in FIG. 6, since liquid crystal panels 123 to 125 are arranged as shown in FIG. 2, LCD cooling openings 301 to 303 for cooling liquid crystal panels 123 to 125, respectively, are arranged at different distances from each other from fans 203 to 205, as shown in FIG. 6. That is, as shown in FIG. 6, among fans 203 to 205, the distance from the air outlet of fan 204 disposed in the center to LCD cooling opening 302 (liquid crystal panel 124) is shorter than the distance from the air outlet of fan 203 to LCD cooling opening 301 (liquid crystal panel 123) and the distance from the air outlet of fan 205 to LCD cooling opening 303 (liquid crystal panel 125).

Figure 7:
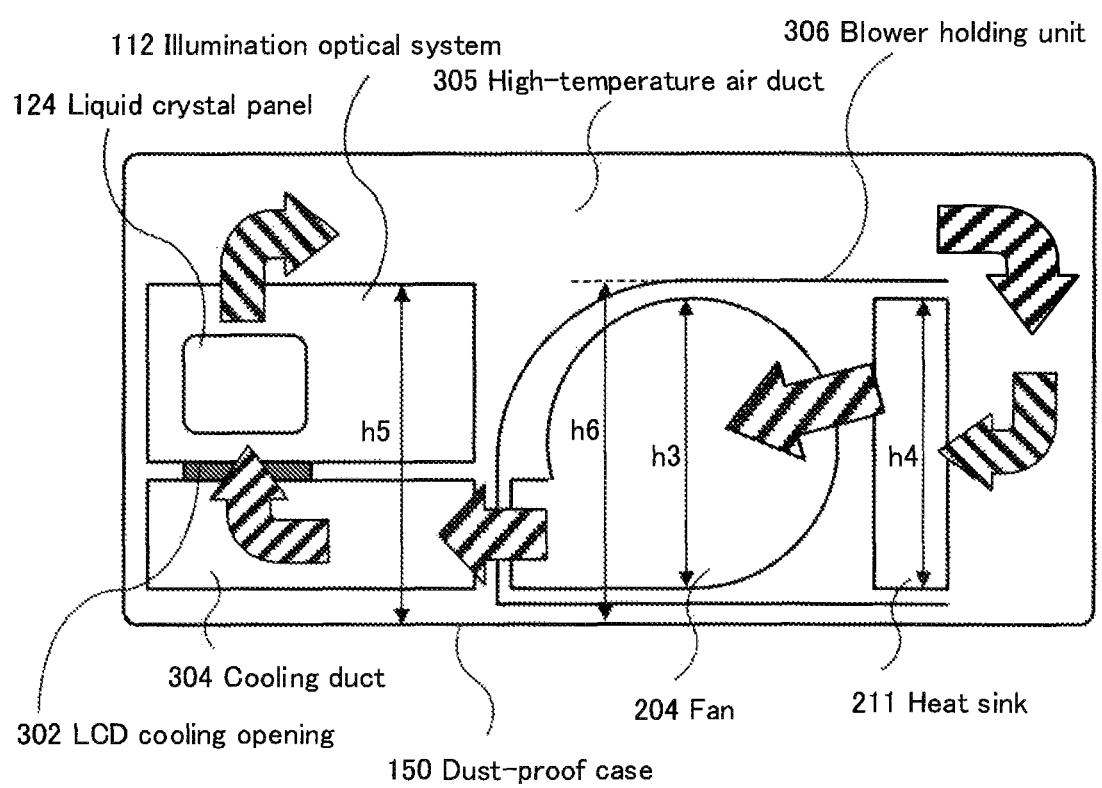
FIG. 7 is a side view of the fan, cooling duct and illumination optical system shown in FIG. 6 viewed from the side direction of the projector.

FIG. 7 is a side view of fan 204, cooling duct 304 and illumination optical system 112 shown in FIG. 6, viewed from the side direction of projector 111. As shown in FIG. 7, cooling duct 304 is disposed at the bottom of illumination optical system 112. Cooling air blown out from fan 204 cools liquid crystal panel 124 from LCD cooling opening 302 through cooling duct 304. High-temperature air duct 305, that is a second duct, guides the air that passed through liquid crystal panel 124, to heat sink 211 in the direction opposite to the direction of the air blown out from fan 204. Heat sink 211 removes heat from the air that has passed through high-temperature air duct 305. Blower holding unit 306 is a blower holding member houses and holds fan 203, and guides the air from which heat has been removed by heat sink 211 to the air inlet of fan 203. Here, high-temperature air duct 305 is a space surrounded by dust-proof case 150 and illumination optical system 112 and blower holding unit 306 is formed along the top surface of dust-proof case 150. That is, high-temperature air duct 305 is a space surrounded at least by the inner wall of the top surface of dust-proof case 150 and of the top surface of blower holding unit 306, a space formed along the top surface of dust-proof case 150. Illumination optical system 112, cooling duct 304, fan 204, blower holding unit 306 and heat sink 211 are housed in dust-proof case 150. Further, heat sink 211 may be held by blower holding unit 306. The height h3 of fan 204 may be of the same height as the height h4 of heat sink 211.

Further, the height h5 from the bottom surface of dust-proof case 150 to the top surface of illumination optical system 112 is preferably made to be the same height as the height h6 from the bottom surface of dust-proof case 150 to the top surface of blower holding unit 306. Thus, it is possible to sufficiently secure the flow path (height) of high-temperature air duct 305, to realize a miniaturization of the circulation cooling system. Further, since the bottom surface of high-temperature air duct 305 is composed of a top surface of illumination optical system 112 and the top surface of blower holding unit 306, so the height h5 is the same as the height h6, the bottom surface of high-temperature air duct 305 becomes a flat surface, it is possible to minimize the loss of the flow of high-temperature air. That is, it is preferable that the difference between the height h5 and h6 is smaller than the preset range (length), so that the bottom surface of high-temperature air duct 305 is substantially flat (short). Further, in FIG. 7, although a configuration in which blower holding unit 306 having a bottom surface is shown, since blower holding unit 306 is intended to form a "third duct" to be described later, the presence or absence of the bottom surface is not limited.

Figure 8:
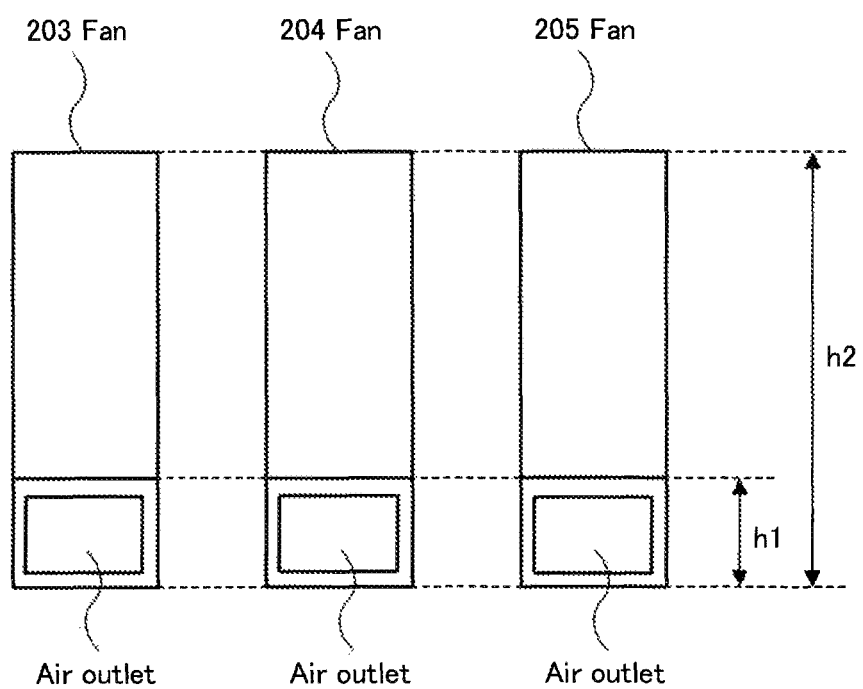
FIG. 8 is a diagram of the arrangement of the fan shown in FIG. 2 viewed from the side of the illumination optical system.

FIG. 8 is a diagram of the arrangement of fans 203 to 205 shown in FIG. 2 viewed from the side of the illumination optical system 112. As shown in FIG. 8, it is preferable that fans 203 to 205 have the same height h1 of the air outlet. Fans 203-205 may also have their own heights h2 identical to each other.

Figure 9:
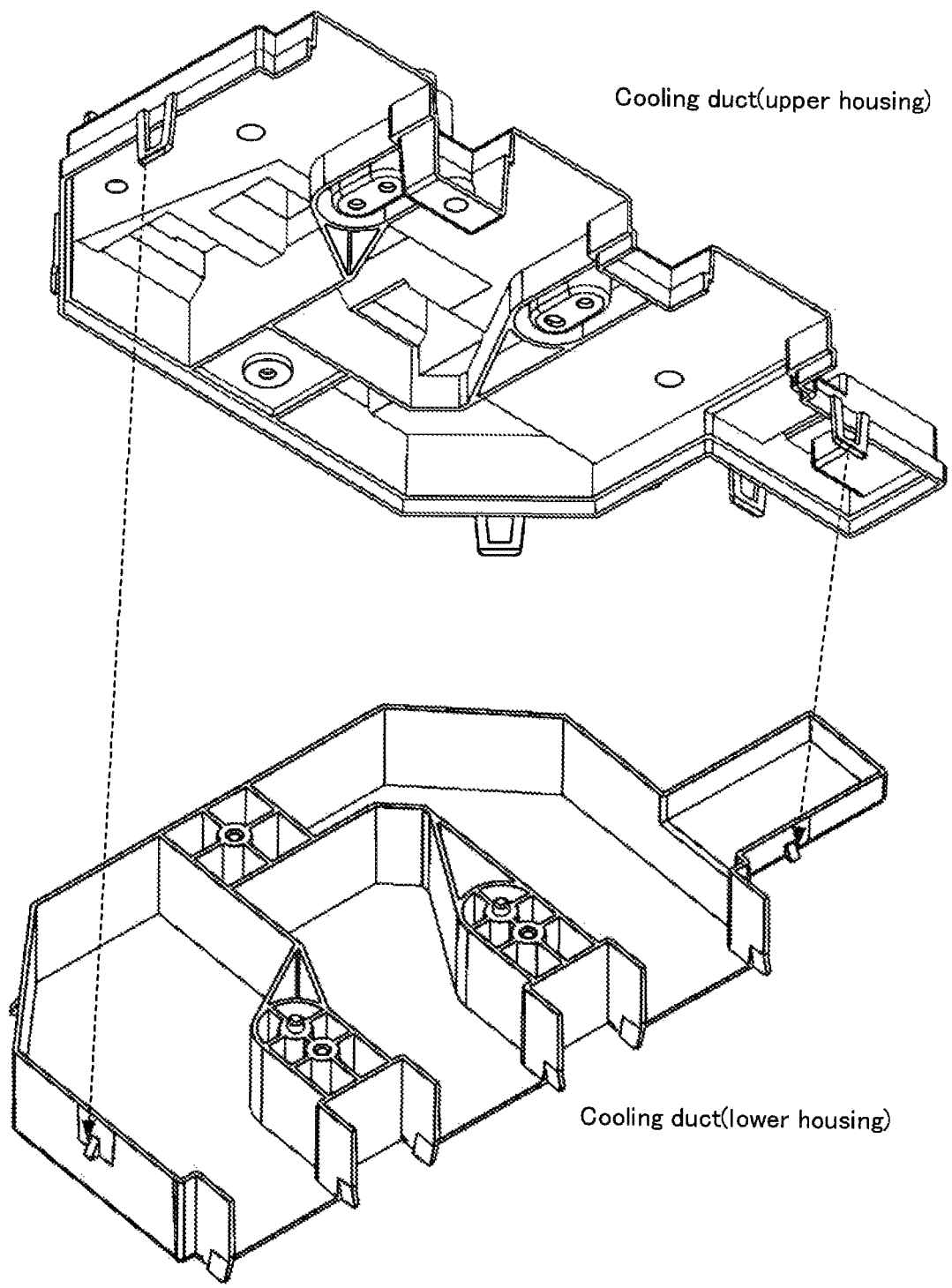
FIG. 9 is a diagram illustrating an example of the structure of the cooling duct shown in FIG. 6.
Figure 10:
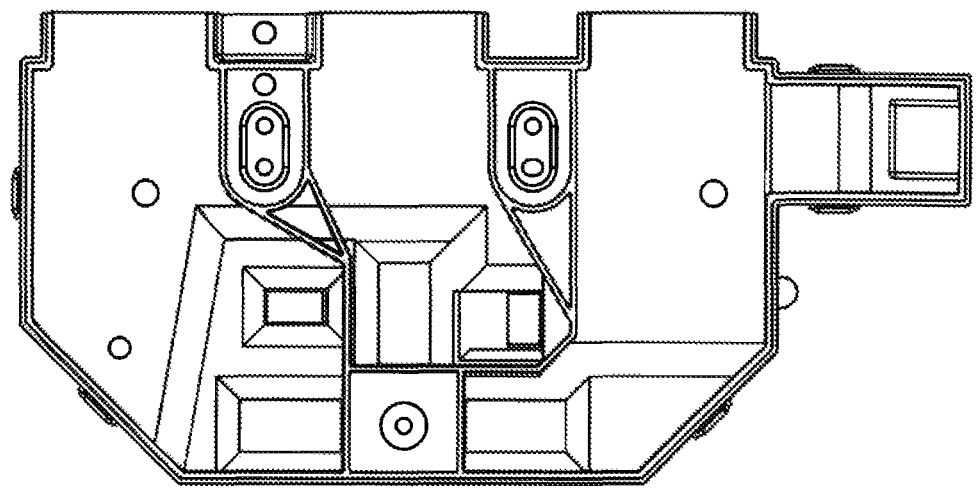
FIG. 10 is a diagram illustrating an example of the structure of the cooling duct shown in FIG. 6.
Figure 10:
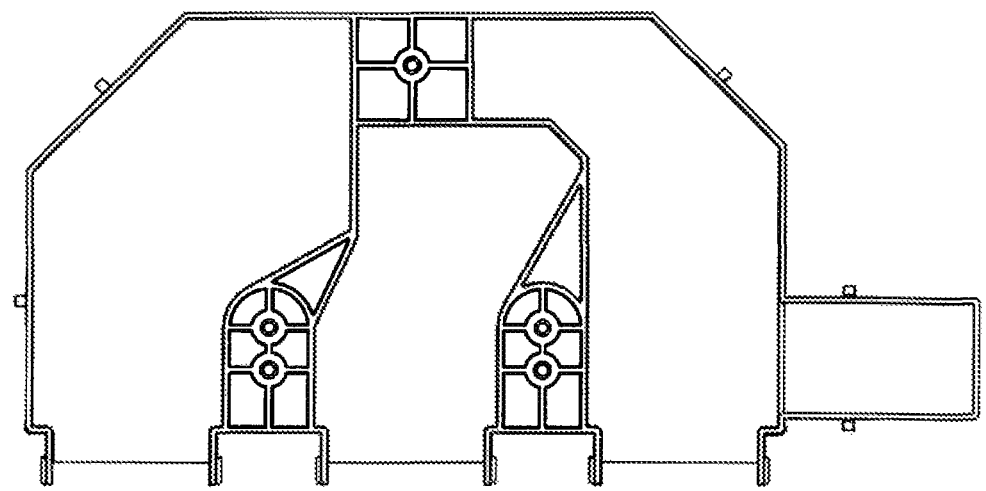
Figure 11:
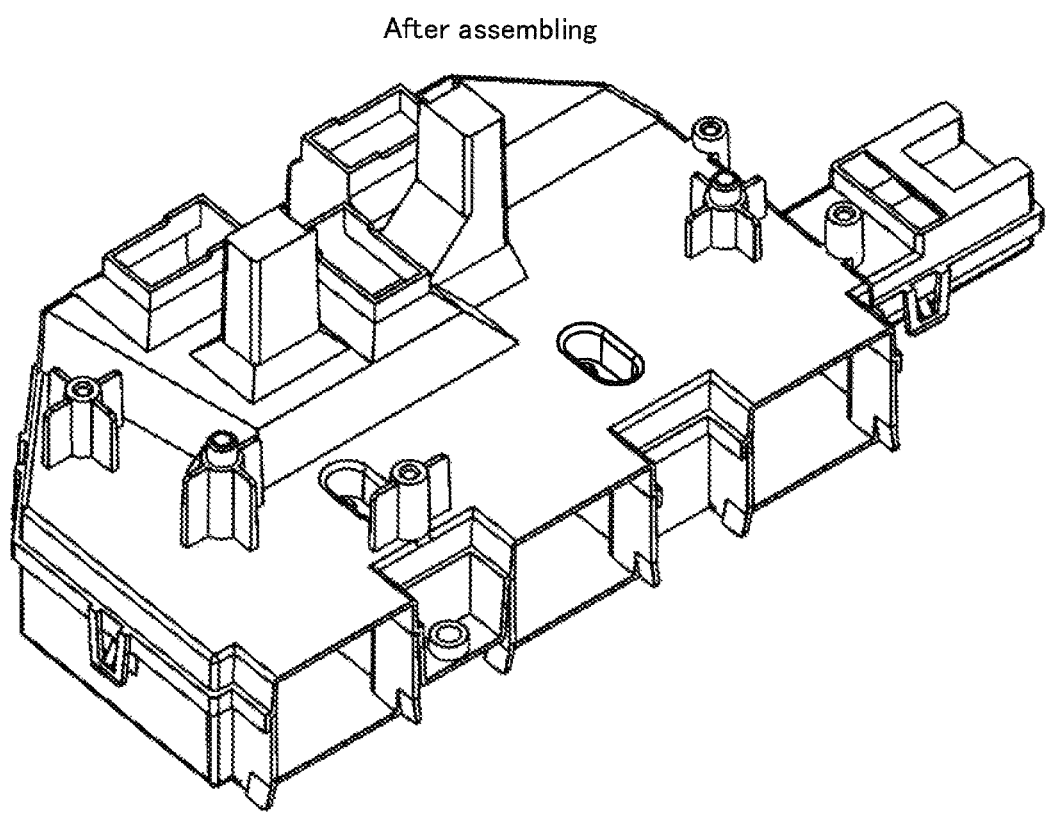
FIG. 11 is a diagram illustrating an example of the structure of the cooling duct shown in FIG. 6.

FIGS. 9 to 11 are diagrams illustrating an example of the structure of cooling duct 304 shown in FIG. 6. FIG. 9 is a perspective view of cooling duct 304 before assembling the upper housing and the lower housing. FIG. 10 is a plan view of cooling duct 304 before assembling the upper housing and the lower housing. FIG. 11 is a perspective view of cooling duct 304 after assembling the upper housing and the lower housing. The upper housing and the lower housing shown in FIG. 9 is assembled by fitting the portion of the claw in accordance with a broken line. As shown in FIGS. 9 to 11, in cooling duct 304, a space through which the cooling air blown out from each of fans 203 to 205 passes is provided separately.

Figure 12:
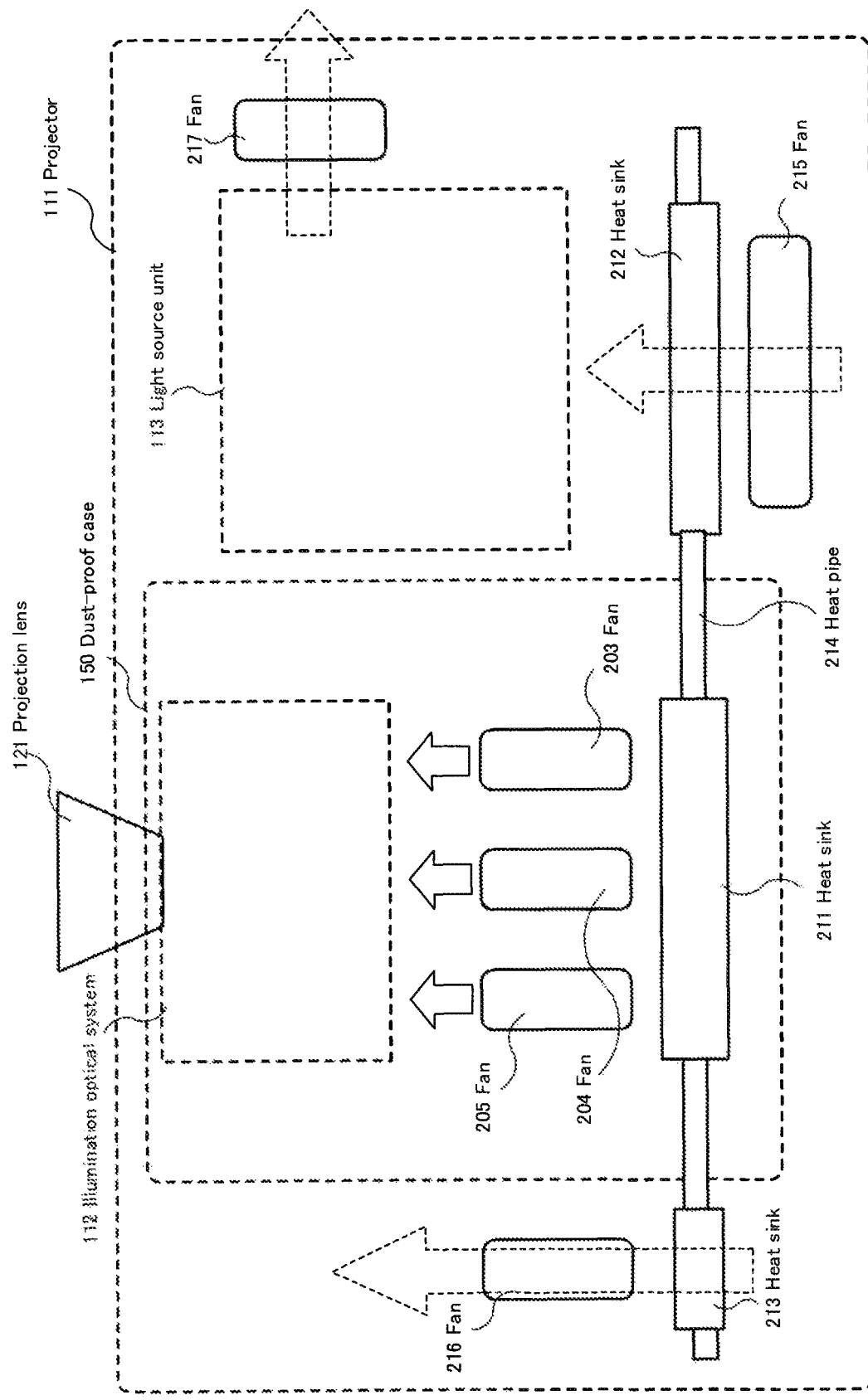
FIG. 12 is a diagram illustrating an example of the positional relationship between the fan and the heat sink provided in the projector shown in FIG. 2.

FIG. 12 is a diagram illustrating an example of a positional relationship between the fan and the heat sink provided in projector 111 shown in FIG. 2. As shown in FIG. 12, projector 111 shown in FIG. 2 includes fans 215 to 217 outside dust-proof case 150 in addition to fans 203 to 205 provided inside dust-proof case 150. Fan 215 is for cooling heat sink 212 for heat dissipation and blows cooling air to heat sink 212 for heat dissipation. Fan 216 is for cooling heat sink 213 for heat dissipation and dissipates heat generated from heat sink 213 for heat dissipation. Fan 217 is for cooling light source unit 113 and takes heat generated from light source unit 113.

Thus, projector 111 in this embodiment, in the optical illumination system of 3LCD in which the optical axis direction passing through the integrator and the PBS and the projection direction of the projected image are arranged vertically, a plurality of fans for cooling the three LCDs (liquid crystal panels) respectively comprises a sealed structure having a configuration arranged along the long side of illumination optical system 112. Projector 111 features a compact circulation cooling configuration that circulates air in dust-proof case 150 with a sealed structure. In projector 111, illumination optical system 112, fans 203-205 for cooling liquid crystal panels 123-125 are provided in the illumination optical system, cooling duct 304 and heat sink 211 are disposed in dust-proof case 150 of the sealed structure. In projector 111, cooling duct 304 is disposed at a bottom portion of illumination optical system 112, fans 203 to 205 are disposed on a side opposite to the side where projection lens 121 of illumination optical system 112 is disposed, and heat sink 211 is disposed behind fans 203 to 205. Further, in projector 111, an illumination optical system to integrator 137 is disposed in dust-proof case 150.

Further, projector 111 in the present embodiment blows the air blown out from fans 203 to 205 through cooling duct 304, cools liquid crystal panels 123 to 125 and the peripheral optical components, and the air that is blown through high-temperature air duct 305 formed in dust-proof case 150, has heat removed from it in heat sink 211 and is sucked into fans 203 to 205. At this time, a partition is provided so that the air from which heat has been removed does not mix with liquid crystal panels 123 to 125 and the high-temperature air after cooling the peripheral optical components. For example, as shown in FIG. 7, blower holding unit 306 may cover other than the surface that is in contact with the high-temperature air of heat sink 211. Further, a partition is provided in which the intake air of fans 203 to 205 in blower holding unit 306 and the air after heat removal flowing through cooling duct 304 are not mixed. For example, a partition may be provided to fill the gap between fans 203 to 205 and blower holding unit 306. As regards dust-proof case 150, it is necessary to seal using a packing or the like so that dust does not enter, since the partition of cooling duct 304 and blower holding unit 306 is in the dust-proof structure, sealing such as packing is not necessary.

Further, since entire dust-proof case 150 is a part of the duct, high-temperature air duct 305 formed by the bottom surface and the top surface and blower holding unit 306 in dust-proof case 150 can be miniaturized without overlapping partitions. Further, blower holding unit 306 has a function of holding fans 203 to 205 and a function of insulating the high-temperature air passing through high-temperature air duct 305 after cooling of liquid crystal panels 123 to 125 with the air removed through heat sink 211. Further, in the optical illumination system of 3LCD in which the optical axis direction through which the integrator and the PBS pass and the projection direction of the projected image are vertically disposed, fans 203 to 205 for cooling the three LCDs (liquid crystal panels) respectively are disposed along the long sides of illumination optical system 112, so that a large intake area of fans 203 to 205 can be secured, the loss of the intake air is small, the length of the flow passage is short, and the pressure loss is small. Further, the width of cooling duct 304 can also be secured widely, respectively, and the loss is small. Therefore, because both the intake air efficiency and the cooling duct efficiency are increased, cooling efficiency is improved.

Furthermore, heat sink 212,213 for heat dissipation on both sides of dust-proof case 150 are provided. Thus, heat sink 211 for heat receiving provided in dust-proof case 150, performs heat removal of high-temperature air, heat is transferred to heat sink 212,213 through heat pipe 214, heat sink 212,213 is cooled and heat is discharged outside the device. Heat sink 211 is connected to heat sink 212,213 at both ends via heat pipe 214, and is also thermally connected. Heat sink 212,213, by being connected to both ends of heat sink 211, since heat that heat sink 211 is received is transferred to both sides, the same effect as when the number of pipes doubled is obtained. Since the heat has a property of being transmitted from the higher to the lower, efficiency is lowered when the point is at a temperature lower than the temperature of the point where the high temperature due to the specks of temperature in heat sink 211 is upstream. By heat sink 212,213 is connected to both sides of heat sink 211, it is possible to prevent a decrease in efficiency caused by specks of temperature.

Further, by providing the parts to integrator 137 in dust-proof case 150, it is possible to cool the parts requiring cooling such as PBS in the same cooling flow and to reduce the number of parts. Further, the alignment of light source unit 113 and illumination optical system 112 are facilitated, it is possible to improve the dust-proof performance structural, and the number of components are reduced.

Further, the cooling air blown out from the cooling fan for LCD cools the optical components such as LCD through the cooling duct. Generally, the cooling duct and fan holder are made of an expensive material with vibration isolation to reduce wind noise generated at that time. Cooling fans for LCDs have a great effect on noise values. In this embodiment, fan 203 to 205, cooling duct 304, and blower holding unit 306 are disposed in dust-proof case 150, and dust-proof case 150 shields the noise, thereby reducing the noise value. Further, because dust-proof case 150 shields the noise, it is possible to adopt an inexpensive material as cooling duct 304 and blower holding unit 306 and to reduce component cost.

As described above, the life cycle of liquid crystal panels 123 to 125 is extended by increasing the cooling efficiency, and the rotational speed of fans 203 to 205 can also be lowered, which makes it possible to reduce the annoying noise value. The structure becomes simple due to blower holding unit 306 and dust-proof case 150 having the two roles described above and it is possible to reduce the size of the entire apparatus. Further, by performing the sealing of dust-proof case 150, it is not necessary to seal the internal parts. Therefore, by reducing the number of parts, it is possible to realize a reduction in the cost of all components that are used. In addition, manufacturing costs can also be reduced.

Third Embodiment

Figure 13:
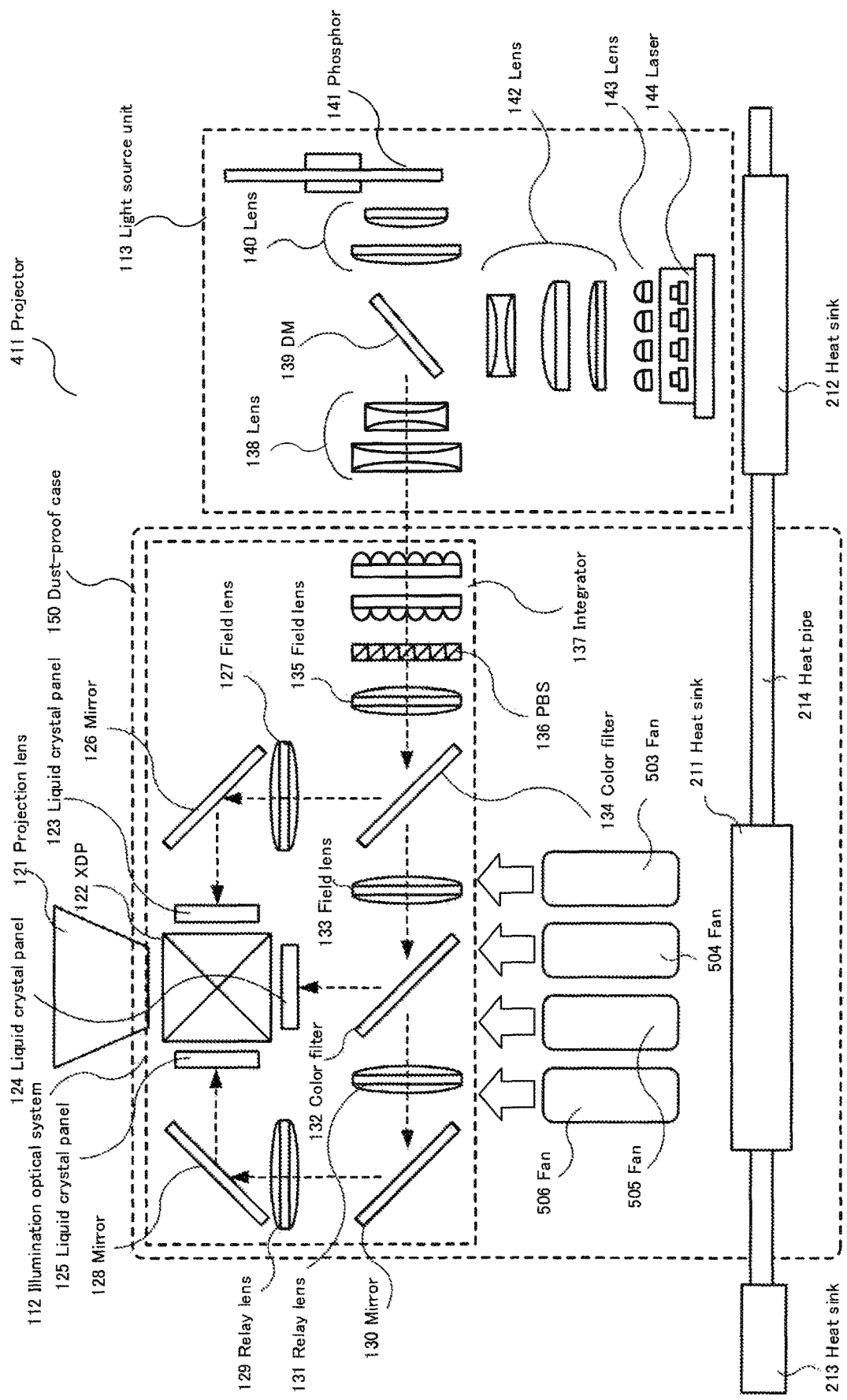
FIG. 13 is a diagram illustrating a third embodiment of the electronic device of the present invention.

FIG. 13 is a diagram illustrating a third embodiment of the electronic device of the present invention. Projector 411, which is an electronic device in this embodiment, as shown in FIG. 13, has illumination optical system 112 and light source unit 113. Illumination optical system 112 and light source unit 113 are the same as that in the second embodiment.

Fans 503-506, which are blowers, are provided to cool liquid crystal panels 123-125, respectively. Fans 503 to 506 are arranged side by side along a first direction in which liquid crystal panel 123 and liquid crystal panel 125 of liquid crystal panels 123 to 125 face each other on a side opposite to the side in which projection lens 121 of liquid crystal panels 123 to 125 is disposed. Fans 503-506 are also arranged such that their respective inlets face each other. Incidentally, when the components constituting illumination optical system 112 are housed in a housing having one rectangular parallelepiped or a corresponding shape capable of storing their layout (broken line of illumination optical system 112 shown in FIG. 13), fans 503 to 506 are disposed on the surface side facing the surface on which projection lens 121 of the housing is disposed. In that case, fans 503-506 may be disposed within the housing or may be disposed outside the housing. The external shapes of fans 503-506 are the same as those of the second embodiment and are the same as the external shapes of fans 203 shown in FIGS. 4 and 5.

Further, heat sink 211 is disposed on a side of fans 503 to 506 opposite to the side of illumination optical system 112. Heat sink 211 removes heat from the intake air drawn in by fans 503-506. Illumination optical system 112, fans 503-506, and heat sink 211 are housed in dust-proof case 150 that maintains a sealed state. Heat sinks 211-213 and heat pipe 214 are the same as those in the second embodiment.

In FIG. 13, a cooling duct for guiding the air blown out from fans 503 to 506 to liquid crystal panels 123 to 125, respectively, and a high-temperature air duct for guiding the air passing through liquid crystal panels 123 to 125 to heat sink 211 are not shown. These will be described with reference to FIG. 15 to be described later.

Incidentally, the rotation of fans 503 to 506 are individually controlled, and the rotational speed of each of the fans may be different from the other. This rotational speed may be set in advance based on the operation of the light modulation in liquid crystal panels 123 to 125, may be one that measures the temperature of liquid crystal panels 123 to 125 and is controlled based on the measured temperature, or may be one that is controlled based on the use period of liquid crystal panels 123 to 125.

Figure 14:
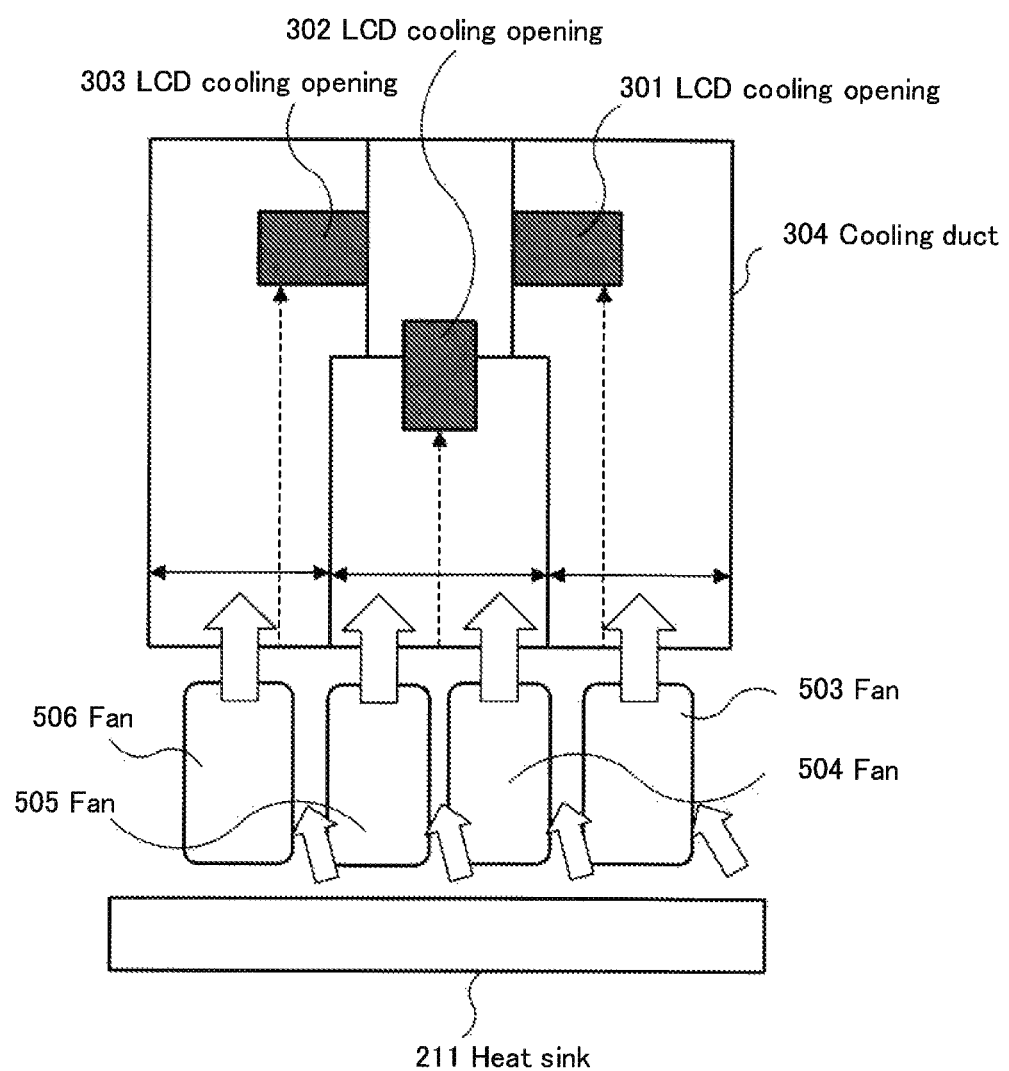
FIG. 14 is a plan view illustrating an example of a configuration of a cooling duct that guides the cooling air blown out from the fan shown in FIG. 13 to the liquid crystal panel.

FIG. 14 is a plan view illustrating an example of a configuration of a cooling duct that guides the cooling air blown out from fans 503 to 506 illustrated in FIG. 13 to liquid crystal panels 123 to 125. As shown in FIG. 14, the cooling air blown out from fans 503 to 506 that sucks the air from which heat has been removed by heat sink 211 passes through the respective spaces provided in cooling duct 304 that is the first duct, and is guided to LCD cooling openings 301 to 303 for cooling liquid crystal panels 123 to 125, respectively. In the example shown in FIG. 14, the cooling air blown out from fan 503 is guided to LCD cooling opening 301 provided for cooling liquid crystal panel 123. Further, the cooling air blown out from fan 504,505 is guided to LCD cooling opening 302 provided for cooling liquid crystal panel 124. Further, the cooling air blown out from fan 506 is guided to LCD cooling opening 303 provided for cooling liquid crystal panel 125. In FIG. 14, a high-temperature air duct for guiding the air passing through liquid crystal panels 123 to 125 to heat sink 211 is not shown. Further, or those cooling air blown out from fan 504 is guided to LCD cooling opening 301, the cooling air blown out from fan 505 may be guided to LCD cooling opening 303.

Incidentally, fans 503 to 506 are arranged at intervals at which a predetermined intake amount can be secured. Further, a partition plate may be provided between each of fans 503 to 506. Further, when fans 503 to 506 perform air intake from both sides, the position of the partition plate may be determined based on the ratio of the air intake capacity from one side to the air intake capacity from the other side. Specifically, for example, when the air intake capacity from the left side surface of fans 503 to 506 is larger than the air intake capacity from the right side surface, the distance from the left side surface of fans 503 to 506 to the partition plate on the left side may be longer than the distance from the right side surface of fans 503 to 506 to the partition plate on the right side.

Also, the positions of the respective air outlets of fans 503-506 relative to cooling ducts 304, i.e., the distances from the air outlets of fans 503-506 to the receptacles of cooling ducts 304, are preferably equal to each other.

Further, as shown in FIG. 14, since liquid crystal panels 123 to 125 are disposed as shown in FIG. 13, LCD cooling openings 301 to 303 for cooling liquid crystal panels 123 to 125, respectively, are disposed at different distances from each other from fans 503 to 506, as shown in FIG. 14. That is, as shown in FIG. 14, among fans 503 to 506, the distance from the air outlet of fan 504,505 for cooling liquid crystal panel 124 to LCD cooling opening 302 (liquid crystal panel 124) is shorter than the distance from the air outlet of fan 503 to LCD cooling opening 301 (liquid crystal panel 123) and the air outlet of fan 506 to LCD cooling opening 303 (liquid crystal panel 125).

Figure 15:
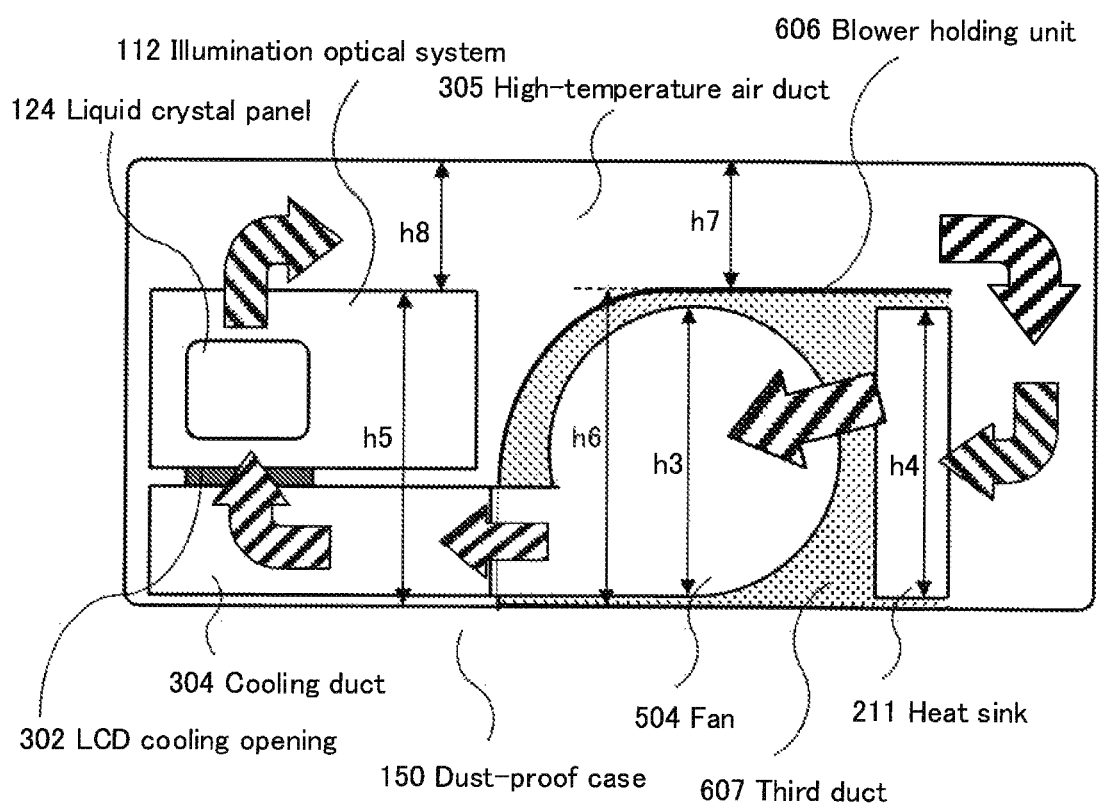
FIG. 15 is a side view of the fan, cooling duct and illumination optical system shown in FIG. 14 viewed from the side direction of the projector.

FIG. 15 is a side view of fan 504, cooling duct 304 and illumination optics 112 shown in FIG. 14, viewed from the side direction of projector 411. As shown in FIG. 15, cooling duct 304 is disposed at the bottom of illumination optical system 112. Cooling air blown out from fan 504 cools liquid crystal panel 124 from LCD cooling opening 302 through cooling duct 304. High-temperature air duct 305, that is a second duct, guides the air passing through liquid crystal panel 124 to heat sink 211 in the direction opposite to the direction of the air blown out from fan 504. Heat sink 211 removes heat from the air that has passed through high-temperature air duct 305. Blower holding unit 606 is a blower holding member that houses and holds fan 504, and guides the air from which heat has been removed by heat sink 211 to the air inlet of fan 504. Here, high-temperature air duct 305 is a space surrounded by dust-proof case 150 and illumination optical system 112 and blower holding unit 606 and is formed from along the top surface of dust-proof case 150, the top surface of the top surface of the inner wall of dust-proof case 150 and the top surface of blower holding unit 606. High-temperature air duct 305 is a space surrounded by at least dust-proof case 150 and blower holding unit 606 and is formed from along the top surface of dust-proof case 150, the top surface of the inner wall of the top surface of dust-proof case 150 and the top surface of blower holding unit 606. Further, the third duct for guiding the air removed heat by heat sink 211 to the air inlet of fan 504 is a space surrounded by the inner wall of blower holding unit 606 and the inner wall of the bottom surface of dust-proof case 150. Illumination optical system 112, cooling duct 304, fan 504, blower holding unit 606 and heat sink 211 is housed in dust-proof case 150. Further, heat sink 211 is surrounded by blower holding unit 606, in order to guide air passing through high-temperature air duct 305 flows to blower holding unit 606; the air always passes through heat sink 211. Further, heat sink 211 may be held by blower holding unit 606. The height h3 of fan 504 may be the same height as the height h4 of heat sink 211. Incidentally, in FIG. 15, the area filled with dots is a third duct 607.

Further, it is preferable that the height h8 from the top surface of illumination optical system 112 to the top surface of dust-proof case 150 and the height h7 from the top surface of blower holding unit 606 to the top surface of dust-proof case 150 is substantially the same height. Thus, it is possible to sufficiently secure the flow path (height) of high-temperature air duct 305, to realize a miniaturization of the circulation cooling system. That is, the difference between the height h8 and h7 is preferably set to be smaller (shorter) than the preset range (length) so that it is possible to sufficiently ensure the flow path of high-temperature air duct 305 (height). Further, it is preferable that the height h5 from the bottom surface of dust-proof case 150 to the top surface of illumination optical system 112 and the height h6 from the bottom surface of dust-proof case 150 to the top surface of blower holding unit 606 is substantially the same height. Since the bottom surface of high-temperature air duct 305 is composed of a top surface of illumination optical system 112 and the top surface of blower holding unit 606 of the height h5 is the same as h6, so that the bottom surface of high-temperature air duct 305 becomes a flat surface, it is possible to minimize the loss of the flow of high-temperature air. That is, it is preferable that the difference between the height h5 and h6 is smaller than the preset range (length) so that the bottom surface of high-temperature air duct 305 is substantially flat (short).

Figure 16:
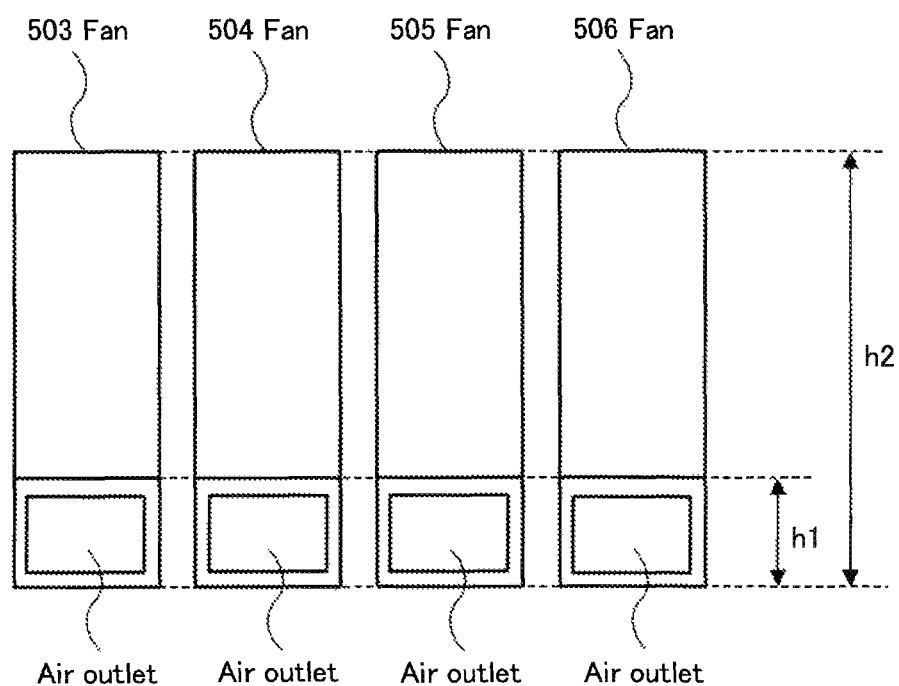
FIG. 16 is a diagram of the arrangement of the fan shown in FIG. 13 viewed from the side of the illumination optical system.

FIG. 16 is a diagram of the arrangement of fans 503 to 506 shown in FIG. 13 viewed from the side of illumination optical system 112. As shown in FIG. 16, it is preferable that fans 503 to 506 have the same height h1 of the air outlet. Fans 503-506 may also have their own heights h2 identical to each other.

Figure 17:
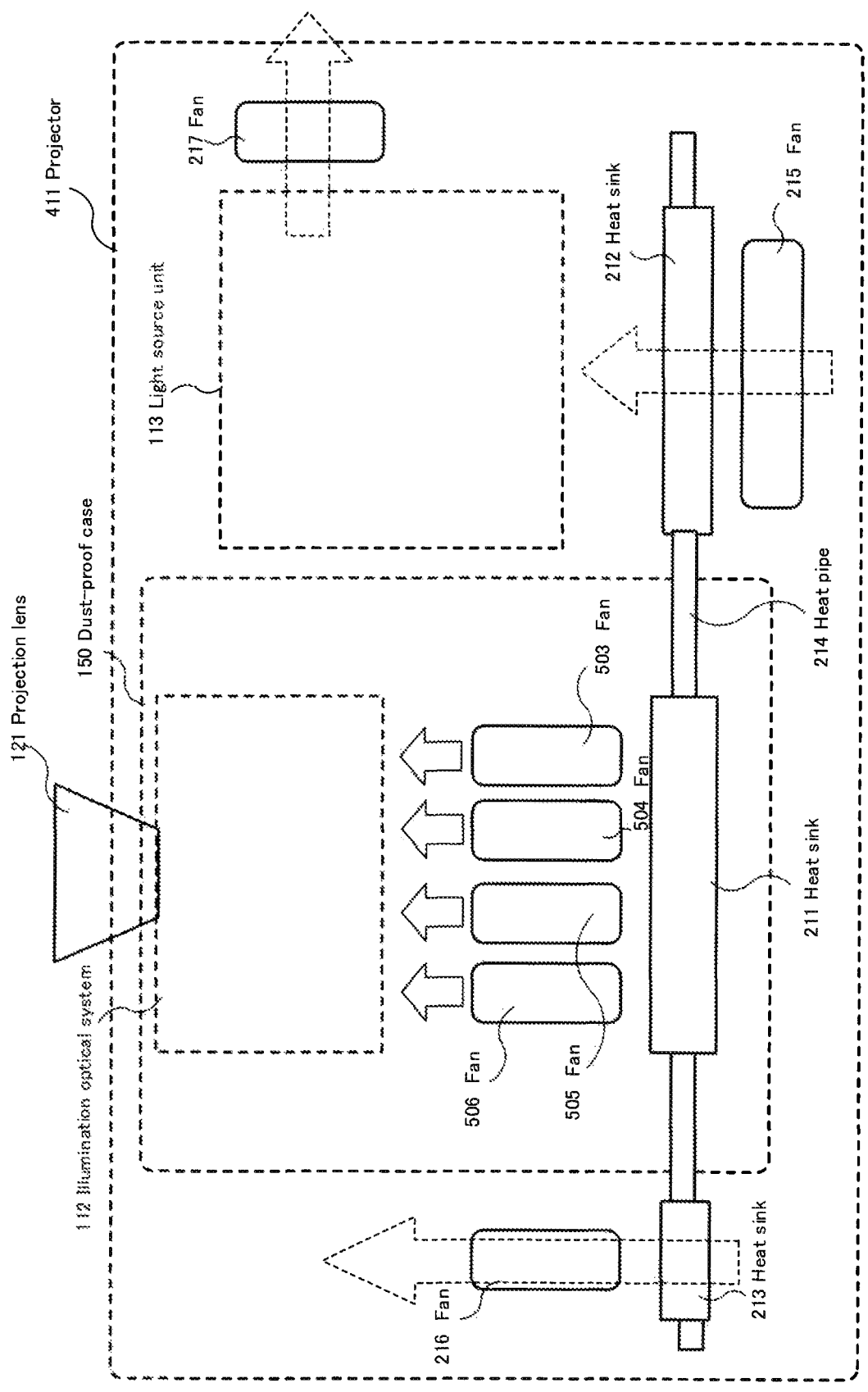
FIG. 17 is a diagram illustrating an example of the positional relationship between the fan and the heat sink provided in the projector shown in FIG. 13.

FIG. 17 is a diagram illustrating an example of a positional relationship between a fan and a heat sink provided in projector 411 shown in FIG. 13. As shown in FIG. 17, projector 411 illustrated in FIG. 13 includes fans 215 to 217 outside dust-proof case 150 in addition to fans 503 to 506 provided inside dust-proof case 150. Fan 215,216, heat sink 212,213 and heat pipe 214 are the same as those in the second embodiment.

Thus, projector 411 in this embodiment, in optical illumination system of 3LCD in which the optical axis direction passing through the integrator and the PBS and the projection direction of the projected image are arranged vertically, a plurality of fans for cooling the three LCDs (liquid crystal panels) respectively, illumination optical system 112 comprises a sealed structure having a configuration arranged along the long side. Projector 411 features a compact circulation cooling configuration that circulates air in a dust-proof case 150 with a sealed structure. In projector 411, illumination optical system 112, fans 503-506 for cooling liquid crystal panels 123-125 provided in the illumination optical system, cooling duct 304 and heat sink 211 are disposed in dust-proof case 150 of the sealed structure. In projector 411, cooling duct 304 is disposed at a bottom portion of illumination optical system 112, fan 503 to 506 are disposed on a side opposite to the side where projection lens 121 of illumination optical system 112 is disposed, and heat sink 211 is disposed behind fans 503 to 506. Further, projector 411 provides an illumination optical system to integrator 137 in dust-proof case 150.

Further, in projector 411 according to the present exemplary embodiment, air blown out from fans 503 to 506 flows through cooling ducts 304 and cools liquid crystal panels 123 to 125 and the peripheral optical components to flow through high-temperature air ducts 305 formed in dust-proof case 150, is removed heat in heat sink 211, and is sucked into fans 503 to 506. At this time, a partition is provided so that the air from which heat has been removed does not mix with the high-temperature air after cooling liquid crystal panels 123 to 125 and the peripheral optical components. For example, as shown in FIG. 15, blower holding unit 606 may cover other than the surface in contact with the high-temperature air of heat sink 211. That is, as shown in FIG. 15, blower holding unit 606 for holding fans 503 to 506 in dust-proof case 150 is provided as a partition between high-temperature air duct 305 through which the air that has passed through liquid crystal panels 123 to 125 flows and the third duct through which the air that has been removed heat by using heat sink 211 flows. Further, a partition is provided in which the intake air of fans 503 to 506 in blower holding unit 606 and the air from which heat has been removed flowing through cooling duct 304 are not mixed. For example, a partition may be provided to fill the gap between fans 503 to 506 and blower holding unit 606. As regards dust-proof case 150, it is necessary to seal using a packing or the like so that dust does not enter, since the partition of cooling duct 304 and blower holding unit 606 is in the dust-proof structure, sealing such as packing is not necessary.

Further, since the entire dust-proof case 150 is a part of the duct, high-temperature air duct 305 formed by the top surface of dust-proof case 150 and the top surface of blower holding unit 606, can be miniaturized without overlapping partitions. In addition, blower holding unit 606 serves to hold fans 503 to 506 and also serves to form a third duct for guiding the air from which heat has been removed using heat sink 211 to the air inlets of fans 503 to 506. Therefore, it is not necessary to separately provide a member such as a partition only for constituting the third duct and is possible to reduce the size of the apparatus. Further, in addition to the function of holding fans 503 to 506, blower holding unit 606 has a function of insulating the high-temperature air passing through high-temperature air duct 305 after cooling liquid crystal panels 123 to 125 with the air from which heat has been removed through heat sink 211. Further, in the optical illumination system of 3LCD in which the optical axis direction through which the integrator and the PBS pass and the projection direction of the projected image are vertically disposed, fans 503 to 506 for cooling the three LCDs (liquid crystal panels) respectively are disposed along the long sides of illumination optical system 112, so that a large intake area of fans 503 to 506 can be secured, the loss of the intake air is small, the length of the flow passage is short, and the pressure loss is small. Further, the width of cooling duct 304 can also be secured widely, respectively, the loss is small. Therefore, the efficiency of both the intake air and the cooling duct is increased and cooling efficiency is improved.

Furthermore, similarly to the second embodiment heat sink 212,213 for heat dissipation on both sides of dust-proof case 150 are provided. Thus, the same effect as the effect described in the second embodiment is achieved. Further, as in the second embodiment, by providing the parts to integrator 137 in dust-proof case 150, it is possible to cool the parts requiring cooling such as PBS in the same cooling flow and is possible to reduce the number of parts. Further, the alignment of light source unit 113 and illumination optical system 112 is facilitated, and it is possible to improve the dust-proof performance structural and reduce the number of components.

Further, the cooling air blown out from the cooling fan for LCD cools the optical components such as LCD through the cooling duct. Generally, the cooling duct and fan holder are made of an expensive material with vibration isolation to reduce wind noise generated at that time. Cooling fans for LCDs have a great effect on noise values. In this embodiment, fan 503 to 506, cooling duct 304, and blower holding unit 606 are disposed in dust-proof case 150, and dust-proof case 150 shields the noise, thereby reducing the noise value. Here, dust-proof case 150, from the viewpoint of the effect of reducing fan noise, is preferably made of metal. Further, because dust-proof case 150 shields the noise, it is possible to use an inexpensive material as cooling duct 304 and blower holding unit 606 and is possible to reduce component costs.

As described above, the life cycle of liquid crystal panels 123 to 125 is extended by increasing the cooling efficiency, and the rotational speed of fans 503 to 506 can also be lowered, which makes it possible to reduce the annoying noise value. Blower holding unit 606 and dust-proof case 150 structure is simplified by having the role (function) described above, it is possible to reduce the size of the entire apparatus. Further, by performing the sealing of dust-proof case 150, it is not necessary to seal the internal parts. Therefore, by reducing the number of parts, it is possible to reduce the cost of all components that are used. In addition, manufacturing costs can also be reduced.

In the second embodiment, the case where the number of fans is three as an example, in the third embodiment has been described as an example a case where the number of fans is four, the number is not limited to these but may be five or more.

This application claims precedence based on an international application PCT/JP2018/020196 filed May 25, 2018, and incorporates all of its disclosure herein.

The invention claimed is:
1. An electronic device, comprising:
   an illumination optical system that outputs light to a projection lens,
   a plurality of blowers that cools liquid crystal panels mounted on the illumination optical system,
   a first duct that guides air blown out from the plurality of blowers to the liquid crystal panels,
   a second duct that guides air passing through the liquid crystal panel in a direction opposite to a direction of the air blown out from the plurality of blowers,
   a heat sink that removes heat from the air that has passed through the second duct; and
   a blower holding member that holds the plurality of blowers, wherein
   the illumination optical system, the plurality of blowers, the first duct, the second duct, the heat sink and the blower holding member are provided in a dust-proof case,
   the second duct is formed surrounded by at least an inner wall of a top surface of the dust-proof case and a top surface of the blower holding member and is formed along the top surface of the dust-proof case,
   the blower holding member forms a third duct for guiding the air from which heat has been removed by the heat sink to an air inlet of the plurality of blowers.
2. The electronic device according to claim 1, wherein the third duct is a space surrounded by an inner wall of the blower holding member and an inner wall of a bottom surface of the dust-proof case.
3. The electronic device according to claim 1, wherein the heat sink is connected to the heat sink for heat dissipation provided on the outside of the dust-proof case.
4. The electronic device according to claim 3, wherein the heat sink is connected to the two heat sinks for heat dissipation, via a heat pipe penetrating each of the two surfaces of the dust-proof case facing in a direction perpendicular to the direction of the air blown out from the plurality of blowers.
5. The electronic device according to claim 1, wherein the illumination optical system includes an integrator that adjusts a uniformity of illumination.
6. The electronic device according to claim 1, wherein each of the plurality of blowers comprises a blower fan.
7. The electronic device according to claim 1, wherein a height of each of the plurality of blowers and a height of the heat sink are the same.
8. The electronic device according to claim 1, wherein the plurality of blowers cool each of the three liquid crystal panels mounted on the illumination optical system, are disposed on a side opposite to a side where the projection lens of the illumination optical system is disposed and are arranged side by side along a first direction facing the two liquid crystal panels of the three liquid crystal panels,
the first duct guides the air blown from the plurality of blowers to the three liquid crystal panels, respectively.

9. The electronic device according to claim 1, wherein a height of the air outlet of each of the plurality of blowers is the same to each other.

10. The electronic device according to claim 1, wherein among the plurality of blowers, a distance from the air outlet of the blower for cooling the liquid crystal panel other than the two liquid crystal panels facing each other of the three liquid crystal panels to the liquid crystal panel to be cooled by the blower is shorter than a distance from the air outlet of the other blower to the liquid crystal panel to be cooled respectively.

11. The electronic device according to claim 8, wherein a position of the air outlet of each of the plurality of blowers in a direction perpendicular to the first direction is the same to each other.

12. The electronic device according to claim 9, wherein the plurality of blowers are disposed at intervals at which a predetermined intake amount can be ensured.

13. The electronic device according to claim 1, wherein the dust-proof case comprises metal.

14. The electronic device according to claim 1, wherein a number of the blowers is three, each of the three blowers cools each of the three liquid crystal panels.

15. The electronic device according to claim 1, wherein a difference between a distance from an inner wall of a bottom surface of the dust-proof case to a top surface of the illumination optical system and a distance from the inner wall of the bottom surface of the dust-proof case to the top surface of the blower holding member is shorter than a predetermined length.

16. The electronic device according to claim 1, wherein a difference between a distance from the inner wall of the top surface of the dust-proof case to a top surface of the illumination optical system and a distance from the inner wall of the top surface of the dust-proof case to the top surface of the blower holding member is shorter than a predetermined length.

17. A projector, comprising:
an electronic device according to claim 1; and
a light source, wherein.
the electronic device receives light from the light source and modulates an incident light.

18. The electronic device according to claim 1, wherein the heat sink is surrounded by the blower holding member.

19. The electronic device according to claim 1, wherein the second duct is formed along the top surface of the inner wall of the dust-proof case and the top surface of the blower holding member.

20. The electronic device according to claim 1, wherein the second duct guides the air passing through the liquid crystal panels to the heat sink in the direction opposite to the direction of the air blown out from the plurality of blowers.

* * * * *